United States Patent
Yang et al.

(10) Patent No.: US 7,187,618 B2
(45) Date of Patent: Mar. 6, 2007

(54) CIRCUIT OF SDRAM AND METHOD FOR DATA COMMUNICATION

(75) Inventors: Ying-Chih Yang, Hsinchu (TW); Jen-Yi Liao, Hsinchu (TW); Yuan-Ning Chen, Taipei (TW); Chao-Yung Liu, Taipei (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 235 days.

(21) Appl. No.: 10/904,267

(22) Filed: Nov. 2, 2004

(65) Prior Publication Data
US 2006/0018178 A1   Jan. 26, 2006

(30) Foreign Application Priority Data
Jul. 20, 2004   (TW) .............................. 93121575 A

(51) Int. Cl.
*G11C 8/00*   (2006.01)
(52) U.S. Cl. .................. 365/230.08; 365/233
(58) Field of Classification Search .......... 365/230.08, 365/233
See application file for complete search history.

(56) References Cited

U.S. PATENT DOCUMENTS

| 6,496,403 | B2 * | 12/2002 | Noda et al. ............. 365/233 |
| 6,867,993 | B2 * | 3/2005 | Ohshima et al. ........... 365/63 |
| 6,944,092 | B2 * | 9/2005 | Kang .................. 365/233 |

* cited by examiner

*Primary Examiner*—Tuan T. Nguyen
(74) *Attorney, Agent, or Firm*—Jiang Chyun IP Office

(57) ABSTRACT

A data communication circuit of a SDRAM for data communication comprises a plurality of data lines coupled to a plurality of data pins. The number of the data lines, according to an embodiment of the present invention, is less than the number of the data pins. When the data communication circuit receives/outputs data, one of the LDQM pin and the UDQM pin are enabled to receive/output a first part of the data. The other LDQM pin and the UDQM pin are enabled. Accordingly, the data communication circuit of the SDRAM, according to an embodiment of the present invention, is capable of transmitting more data using a bus with a narrow width.

15 Claims, 6 Drawing Sheets

CIRCUIT OF SDRAM AND METHOD FOR DATA COMMUNICATION

CROSS-REFERENCE TO RELATED APPLICATION

This application claims the priority benefit of Taiwan application serial no. 9312575, filed Jul. 20, 2004.

BACKGROUND OF THE INVENTION

1. Field of the Invention

The present invention relates to a synchronous dynamic random access memory (SDRAM), and more particularly to a data communication circuit of SDRAM and a data communication method of a SDRAM, which is adapted for an optical storage medium.

2. Description of Related Art

FIG. 1 is a schematic circuit block diagram showing a prior art data communication circuit of a SDRAM. Referring to FIG. 1, the prior data communication circuit 100 of the SDRAM comprises a plurality of control lines 110, such as /CS, /RAS, /CAS, /WE, and so on, for transmitting control signals to the SDRAM 102. The data communication circuit 100 also comprises address lines 120 and data lines 130. The address lines 120 transmit address signals from the data communication circuit 100 to the SDRAM 102. The data lines 130 transmit data from the data communication circuit 100 to the SDRAM 102. The data lines 130 of the data communication circuit 100 are coupled to the data pins, Q1–Qn, of the SDRAM 102. Generally, each of the data lines 130 of the data communication circuit 100 is coupled to each of the data pins, Q1–Qn, of the SDRAM 102, respectively. The number of the data lines 130 represents the width of the data bus of the data communication circuit 100.

The specification of SDRAM includes X1, X2, X4, X8, X16 and X32. Due to the market demand, the width of the data bus thus is limited. The situation is apparent for low-capacity electronic devices, such as video compact disk systems. For example, a 16-M bite memory usually adapts a 1 M×16 package. It means that a data bus with ×16 width is required. For those low-capacity electronic devices, the selection of the width of the data bus is not flexible due to the package request.

SUMMARY OF THE INVENTION

Accordingly, the present invention is directed to a data communication circuit of a synchronous dynamic random access memory (SDRAM) capable of transmitting/receiving a large number of data using a data bus with a narrow width.

The present invention is also directed to a data communication method of a SDRAM, which is adapted for low-capacity electronic devices.

The present invention discloses a data communication circuit of a synchronous dynamic random access memory (SDRAM). The SDRAM comprises a plurality of data pins for receiving or outputting data. The SDRAM comprises an upper data mask (UDQM) pin and a lower data mask (LDQM) pin. The data communication circuit comprising a data input circuit and a data output circuit. The data input circuit is coupled to the data pins of the SDRAM through a plurality of data lines. The number of data lines are less than the number of data pins. The data input circuit receives a first part of the data from a part of the data pins during a period of a preset clock signal. The data pins receive a second part of the data from the other part of the data pins during the next period of the preset clock signal. The data output circuit is coupled to the data pins through the data lines. The data output circuit outputs the first part of the data to the part of the data pins during the period of the preset clock signal. The data circuit outputs the second part of the data to the other part of the data pins during the next period of the preset clock signal. The data communication circuit of the present invention further comprises a mask signal generating circuit, which is coupled to the UDQM pin and the LDQM pin. The mask signal generating circuit enables the UDQM pin or the LDQM pin depending upon whether the data communication circuit outputs/inputs the first part or the second part of the data.

In an embodiment of the present invention, the first part of the data comprise one of high address data and low address data, and the second part of the data comprise another of the low address data or the high address data.

In an embodiment of the present invention, the data input circuit comprises a first D-type flip-flop circuit and a second D-type flip-flop circuit. The first D-type flip-flop circuit receives the first part of the data input into the data communication circuit and outputs the first part of the data according to the preset clock signal to the second D-type flip-flop circuit. The second D-type flip-flop circuit receives an output of the first D-type flip-flop circuit and the second part of the data of the data communication circuit, and reproduces the data by combining the first part data and the second part data according to the preset clock signal.

The data output circuit comprises a third D-type flip-flop circuit, a selector and a fourth D-type flip-flop circuit. The third D-type flip-flop circuit receives the second part of the data output from the data communication circuit and outputs the second part of the data to the selector according to the preset clock signal. The selector receives an output of the third D-type flip-flop circuit and the first part of the data of the data communication circuit, and outputs the first part of the data or the second part of the data according to a counting signal. The fourth D-type flip-flop circuit receives an output of the selector, and outputs the first part of the data or the second part of the data to a SDRAM according to the preset clock signal.

The present invention also discloses a data communication method of a synchronous dynamic random access memory (SDRAM). The SDRAM comprises a plurality of data pins coupled to a data bus of an optical storage medium. A width of the data bus is smaller than a number of the data pins. The SDRAM comprises an upper data mask (UDQM) pin and a lower data mask (LDQM) pin. The data communication method is described as following. One of the UDQM pin and the LDQM pin is enabled when outputting the data to the SDRAM, and a first part of data is outputting to part of the data pins of the SDRAM. The other one of the UDQM pin and the LDQM pin is enabled and a second part of the data is output thereto. The first part of the data is received from a part of the data pins and then the second part of the data is received from the other part of the data pins when the SDRAM receives the data. The data is generated by combining the first part and the second part of the data.

In an embodiment of the present invention, the data communication method further comprises providing a preset clock signal.

In an embodiment of the present invention, the step of outputting the data to the SDRAM further comprises defining a period of a next preset clock signal as a first period while outputting the data to the SDRAM. Wherein one of the UDQM pin and the LDQM pin is enabled during the first period and the first part of the data is outputted; and the second part of the data is locked up during the first period. The other UDQM pin and the LDQM pin is enabled during the second period and the second part of the data is outputted.

In an embodiment of the present invention, the step of receiving the data by the SDRAM further comprises defining a period of a next preset clock signal as a first period while outputting the data to the SDRAM. Wherein one of the UDQM pin and the LDQM pin is enabled during the first period and the first part of the data is received. The other one of the UDQM pin and the LDQM pin is enabled during the second period and the second part of the data is received. The data is created by combining the first part of the data and the second part of the data.

Accordingly, the data communication circuit of the present invention comprises the data input circuit and the data output circuit. The data to be transmitted is divided into two parts. The first part and the second part of data are transmitted at two sequential periods. Thus, it is possible to transmit a large number of data using a data bus with a narrow width. Accordingly, the present invention can be adapted for low-capacity electronic devices, such as optical storage media.

The above and other features of the present invention will be better understood from the following detailed description of the preferred embodiments of the invention that is provided in communication with the accompanying drawings.

DESCRIPTION OF EMBODIMENTS

Figure 1:
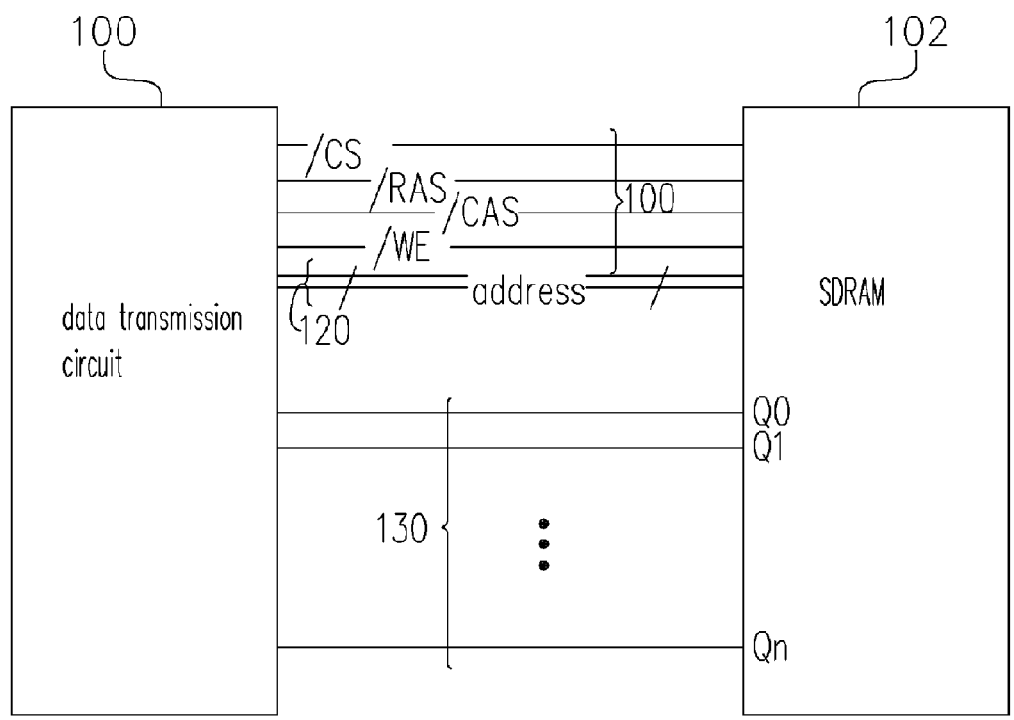
FIG. 1 is a schematic circuit block diagram showing a prior art circuit of a SDRAM.
Figure 2:
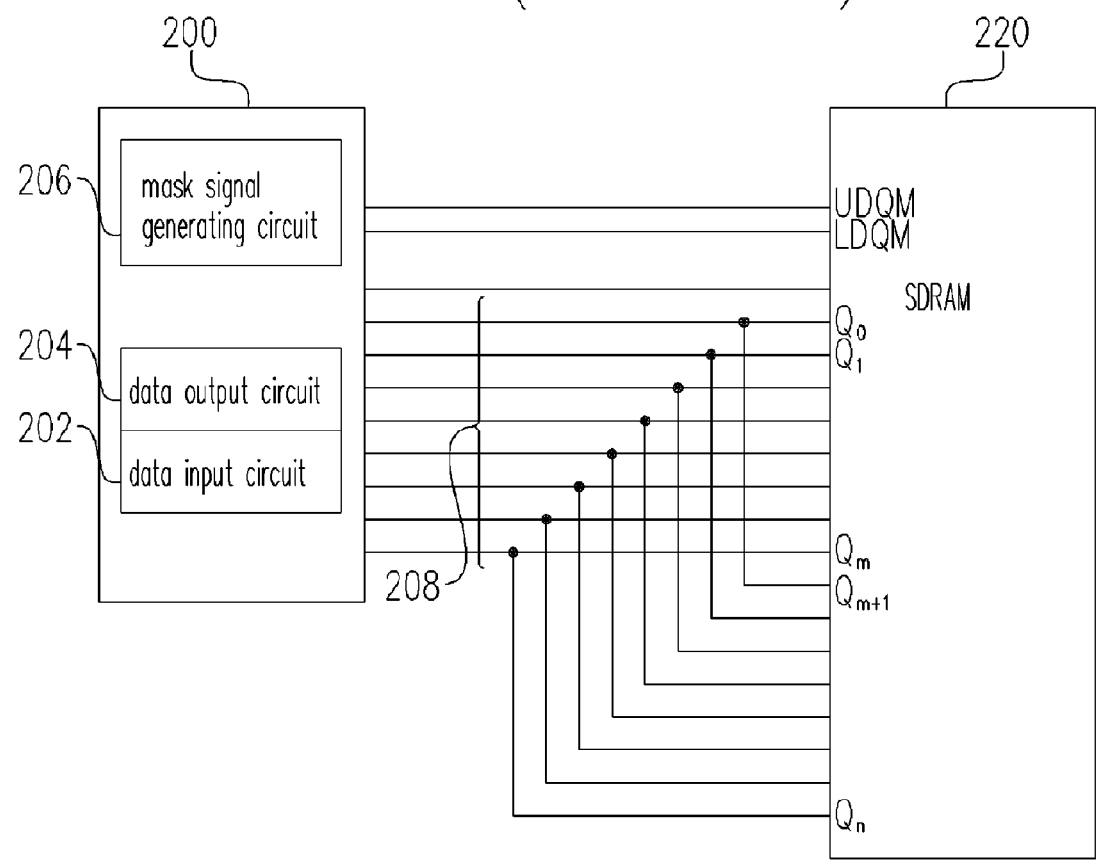
FIG. 2 is a schematic drawing showing a circuit of a SDRAM according to an embodiment of the present invention.

FIG. 2 is a schematic drawing showing a data communication circuit of a SDRAM according to an embodiment of the present invention. Referring to FIG. 2, the data communication circuit 200 is adapted for an optical storage medium, such as a video compact disk (VCD) system or a digital video display (DVD) system for data communication with the SDRAM 220. The data communication circuit 200 comprises a data input circuit 202, a data output circuit 204 and a mask signal generating circuit 206. The data input circuit 202 and the data output circuit 204 are coupled to the data pins Q0~Qn of the SDRAM 220 through the data lines 208. The number of data lines 208, i.e. the width of the data bus, are less than the data pins Q0~Qn of the SDRAM 220. The SDRAM 220 comprises an upper data mask (UDQM) pin and a lower data mask (LDQM) pin which are coupled to the mask signal generating circuit 206.

Figure 3:
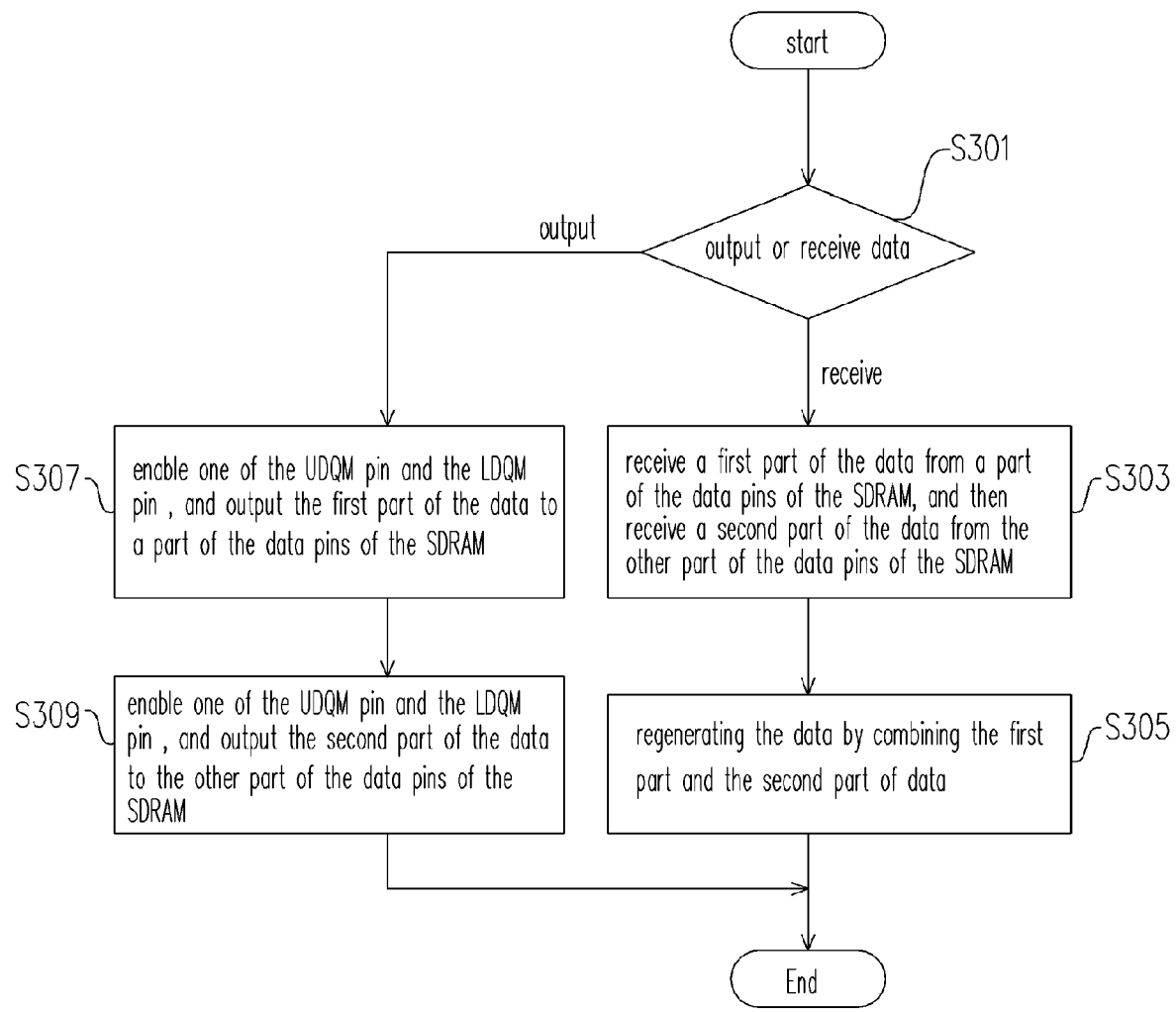
FIG. 3 is a flowchart showing a data communication method of a SDRAM according to an embodiment of the present invention.

FIG. 3 is a flowchart showing a data communication method of a SDRAM according to an embodiment of the present invention. Referring to FIG. 3, at step S301, whether the data communication circuit 200 received the data from the SDRAM 220 or the data is output to the SDRAM 220 is determined. At step S303, wherein when the SDRAM 220 receives the data, the data input circuit 202 receives a first part of the data from a part of the data pins of the SDRAM, such as Q0–Qm, and then receives a second part of the data from the other part of the data pins of the SDRAM, such as Qm+1~Qn. At step S305, the data communication circuit 200 regenerates the data by combining the first part of the data and the second part of the data. On the other hand, at step S307, when the data communication circuit 200 would output data to the SDRAM 220, the mask signal generating circuit 206 outputs a mask signal for enabling one of the UDQM pin and the LDQM pin, and the first part of the data is output to the part of the data pins, such as Q0–Qm. At step S309, the mask signal generating circuit 206 outputs the mask signal for enabling the other one of the UDQM pin and the LDQM pin, and the second part of the data is output to the other part of the data pins, such as Qm+1~Qn.

In an embodiment of the present invention, the first part of the data comprises one of high address data and low address data, and the second part of the data comprises the remainder of the low address data or the high address data.

Figure 4A:
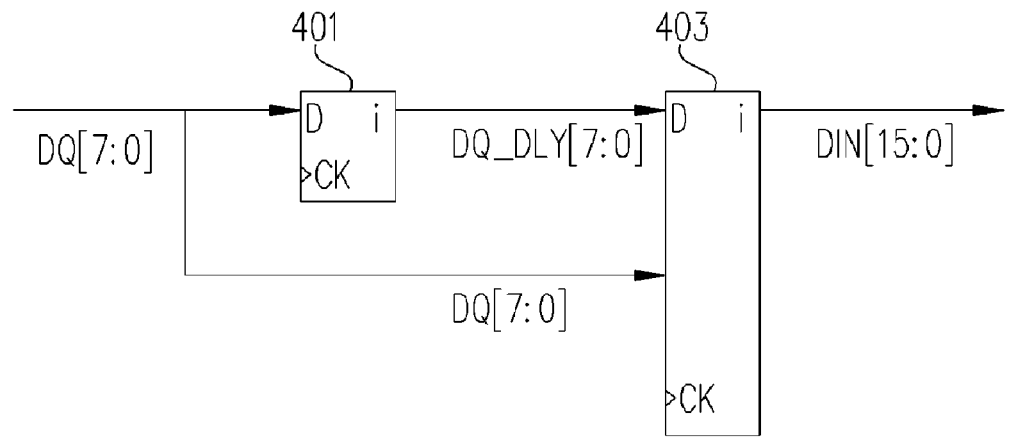
FIG. 4A is a schematic circuit block diagram of a data input circuit according to an embodiment of the present invention.

FIG. 4A is a schematic circuit block diagram of a data input circuit according to an embodiment of the present invention. Referring to FIG. 4A, it is assumed that the width of the data bus of the data input circuit is 8, and the SDRAM has 16 data pins. In this embodiment of the present invention, the data input circuit 202 comprises a first D-type flip-flop circuit 401 and a second D-type flip-flop circuit 403. The input of the first D-type flip-flop circuit 401 is coupled to the data bus DQ [7:0]. The second D-type flip-flop circuit 403 receives an output DQ_DLY[7:0] of the first D-type flip-flop circuit 401 and the data bus DQ [7:0].

Figure 4B:
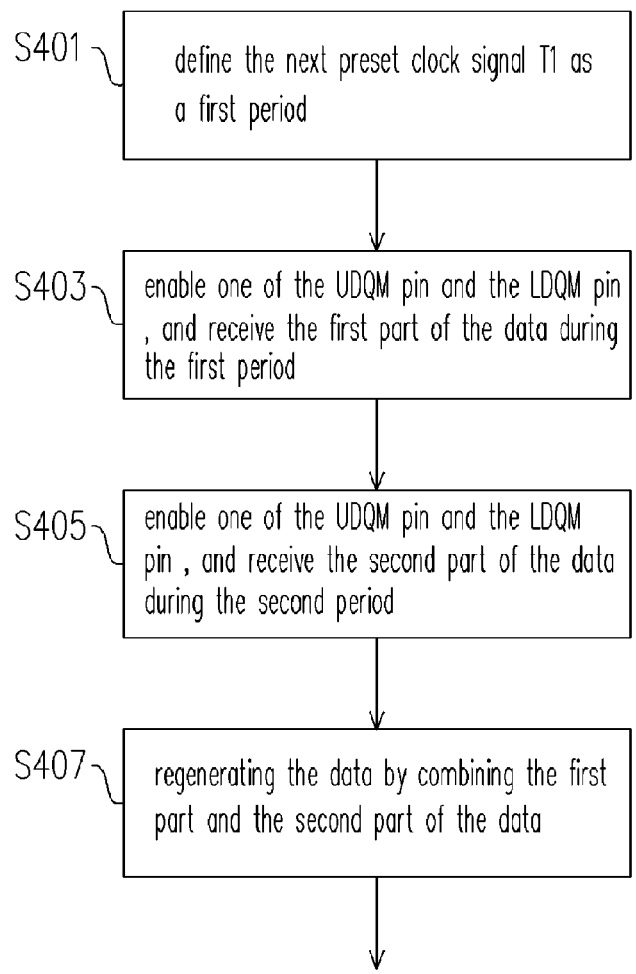
FIG. 4B is a flowchart showing a data input method according to an embodiment of the present invention.
Figure 4C:
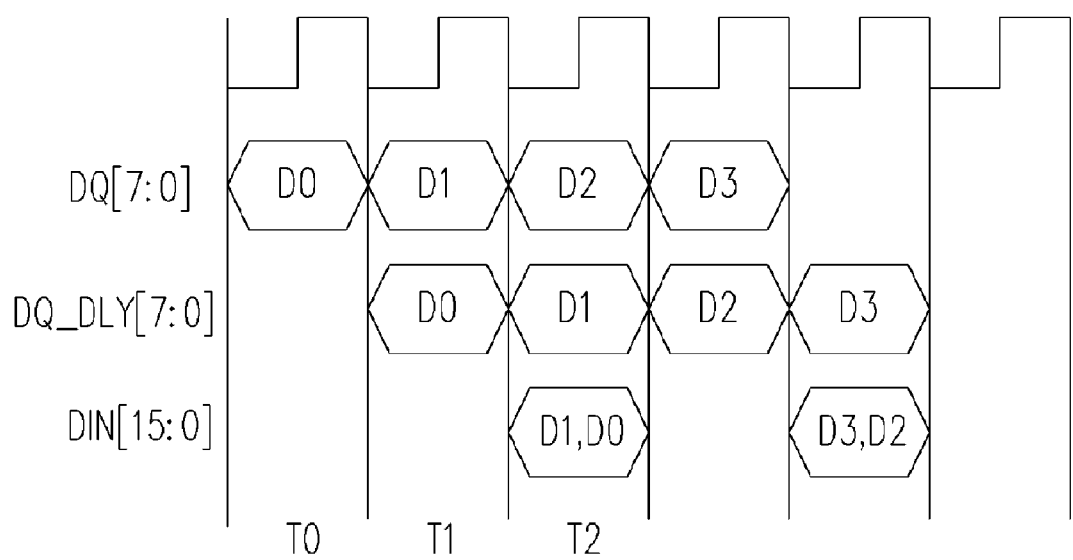
FIG. 4C is a signal time sequence of the data input circuit of FIG. 4A.

FIG. 4B is a flowchart showing a data input method according to an embodiment of the present invention. FIG. 4C is a signal time sequence of the data input circuit of FIG. 4A. Referring to FIGS. 4B and 4C, at step S401, a period of a next preset clock signal T1 is defined as a first period while the data input circuit 202 about to receive the data transmitted from the SDRAM at the period T0 of the present clock signal CK. At step S403, one of the UDQM pin and the LDQM pin is enabled during the first period T1. The first D-type flip-flop circuit 401 receives and locks the first part D0 of the data from the data bus DQ[7:0]. At step S405, another one of UDQM pin and the LDQM pin is enabled during the second period. The first D-type flip-flop circuit 401 outputs the first part D0 of the data DQ_DLY[7:0] to the second D-type flip-flop circuit 403. The second part D1 of the data is transmitted from the data bus DQ[7:0] to the second D-type flip-flop circuit 403 through the output DQ_DLY[7:0] of the first D-type flip-flop circuit 401. In this embodiment, at step S407, the second D-type flip-flop circuit 403, during the second period T2, regenerates the data by combining the first part D0 and the second part D1 of the data and outputs the original data at the output terminal DIN[15:0].

Figure 5A:
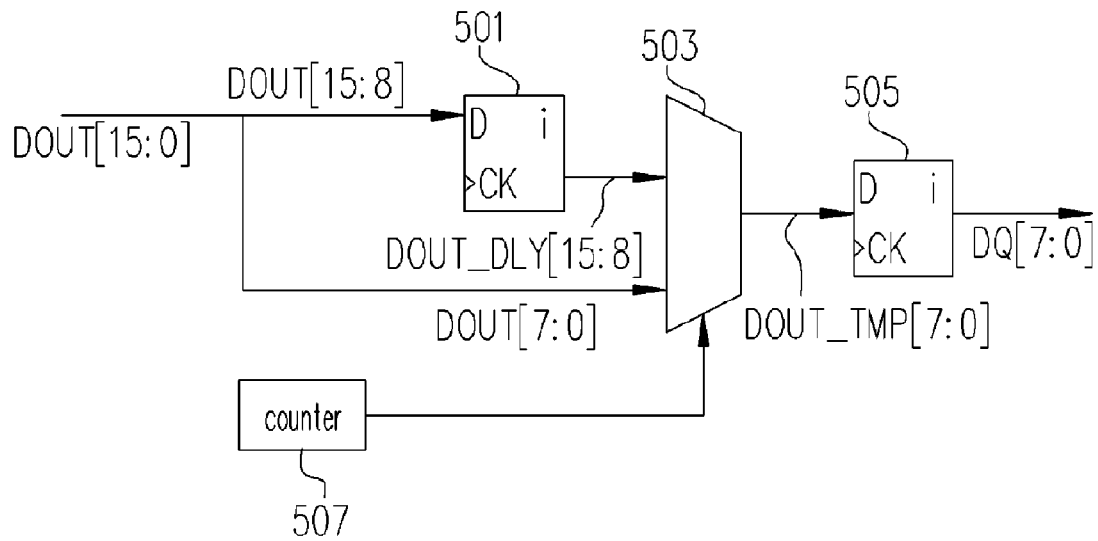
FIG. 5A is a schematic circuit block diagram of a data output circuit according to an embodiment of the present invention.

FIG. 5A is a schematic circuit block diagram of a data output circuit according to an embodiment of the present invention. Referring to FIG. 5A, it is assumed that the data communication circuit has a local bus DOUT[15:0] which has a width of 16 for transmitting data to the SDRAM. In this embodiment, the input of the third D-type flip-flop circuit 501 is coupled to a part DOUT[15:8] of the local bus DOUT[15:0]. The output DOUT_DLY[15:8] of the third D-type-flip-flop circuit 501 is coupled to the input terminal of the selector 503. The other input terminal of the selector 503 is coupled to the other part DOUT[7:0] of the local bus DOUT[15:0]. The output terminal DOUT_TMP[7:0] of the selector 503 is coupled to the fourth D-type flip-flop circuit 505. The output terminal of the fourth D-type flip-flop circuit 505 is coupled to the data pins of the SDRAM through the data bus composed of the data lines. It is assumed that the number of the data lines, i.e. the width of the data bus, is 8. The selective terminal of the selector 503 receives the counting signal from the counter 507 for determining whether the output terminal DOUT_TMP[7:0] should be coupled to the input terminal DOUT[15:8] or DOUT[7:0].

Figure 5B:
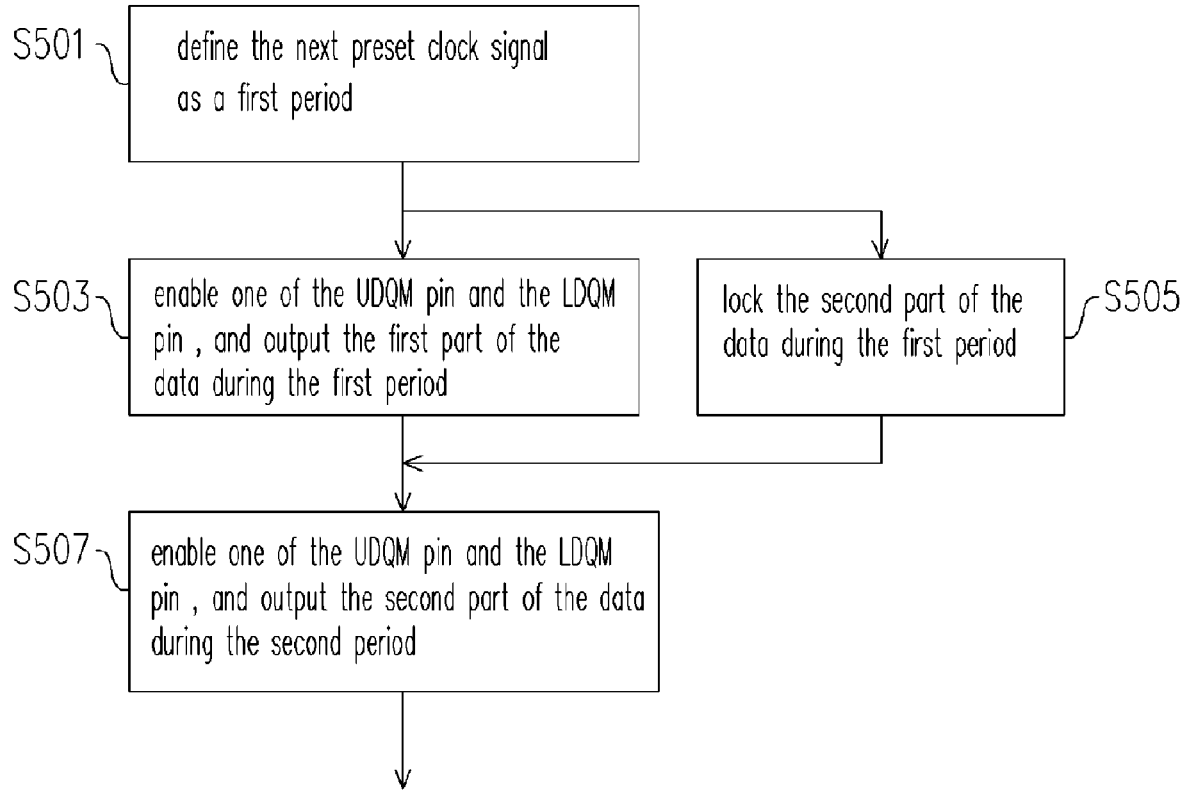
FIG. 5B is a flowchart showing a data output method according to an embodiment of the present invention.
Figure 5C:
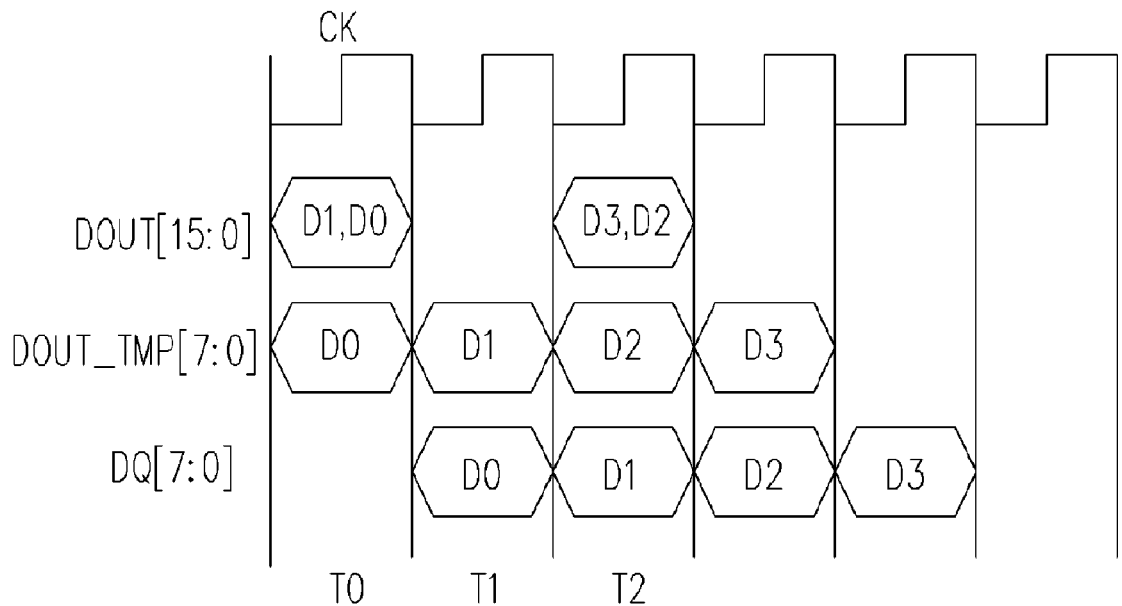
FIG. 5C is a signal time sequence of the data input circuit of FIG. 5A.

FIG. 5B is a flowchart showing a data output method according to an embodiment of the present invention. FIG. 5C is a signal time sequence of the data input circuit of FIG. 5A. Referring to FIGS. 5B and 5C, at step S501, a period of a next preset clock signal T1 is defined as a first period while the data to be transmitted from the local bus DOUT[15:0] to the SDRAM at the period T0 of the present clock signal CK. The first part D0 of the data is transmitted from DOUT[7:0] of part of the local bus DOUT[15:0] to the selector 503. The counter 507 outputs the counting signal so that the selector 503 transmits the first part D0 of the data to the forth D-type-flip-flop directly and is locked during the period T0. The second part D1 of the data is simultaneously transmitted from another part DOUT[15:8] of the local bus DOUT[15:0] to the third D-type flip-flop circuit 501 and is locked during the period T0. At step S503, one of the UDQM pin and the LDQM pin of the SDRAM is enabled during the first period T1. The fourth D-type flip-flop circuit 505 outputs the first part D0 of the data to the part of the data pins of the SDRAM through the data bus DQ[7:0]. The third D-type flip-flop circuit 501 substantially simultaneously outputs the second part D1 of the data to the selector 503. At step S503, the counter 507 outputs the counting signal so that the selector 503 outputs the second part D1 of the data to the fourth D-type flip-flop circuit 505 and then the second part D1 of the data is locked. At step S507, another one of the UDQM pin and the LDQM is enabled during the second period T2. The fourth D-type flip-flop circuit 505 outputs the second part D1 of the data to another part of the data pins of the SDRAM.

Figure 6:
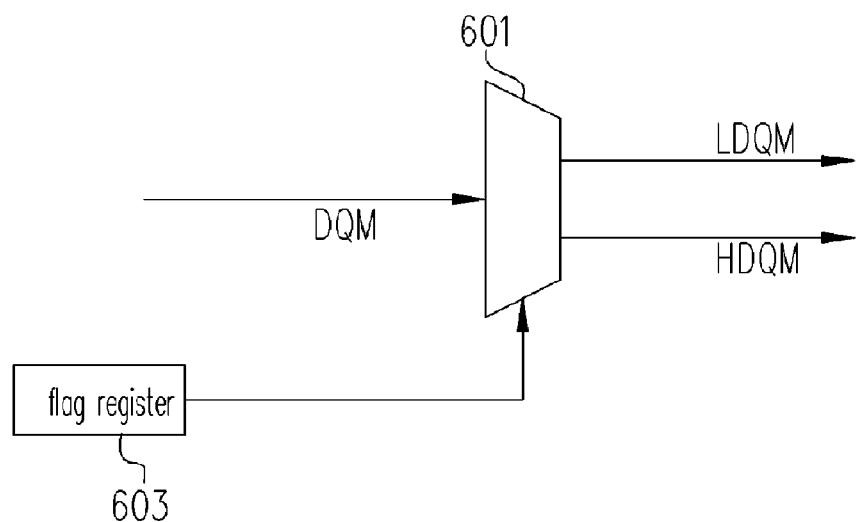
FIG. 6 is a circuit block diagram showing a mask signal generating circuit according to an embodiment of the present invention.

FIG. 6 is a circuit block diagram showing a mask signal generating circuit according to an embodiment of the present invention. Referring to FIG. 6, the mask signal generating circuit comprises a multiplexer 601. The multiplexer 601 receives the mask signal DQM and then determines whether the mask signal DQM should be transmitted to the LDQM or the UDQM of the SDRAM according to the flag status stored, for example, in the flag register 603.

Accordingly, the present invention controls the UDQM pin and the LDQM pin of the SDRAM so as to divide the data into two parts for transmission. The data can be transmitted in two steps. Therefore, more data can be transmitted to the SDRAM using a data bus with a narrow width. Accordingly, the present invention can be adapted for low-capacity electronic devices.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A data communication circuit of a synchronous dynamic random access memory (SDRAM), wherein, the SDRAM comprises a plurality of data pins, for receiving or outputting a data, and the SDRAM further comprises an upper data mask (UDQM) pin and a lower data mask (LDQM) pin, the data communication circuit comprising:
 a data input circuit, coupled to the data pins through a plurality of data lines, a number of the data lines is less than a number of the data pins, wherein the data input circuit receives a first part of the data from a part of the data pins during a period of a preset clock signal and the data pins receives a second part of the data from another part of the data pins during a next period of the preset clock signal;
 a data output circuit, coupled to the data pins through the data lines, for the data output circuit outputting the first part of the data to the part of the data pins during the period of the preset clock signal, and outputting the second part of the data to another part of the data pins during the next period of the preset clock signal; and
 a mask signal generating circuit, coupled to the UDQM pin and the LDQM pin, for enabling the UDQM pin or the LDQM pin depending upon whether the data output circuit outputs/receives the first part or the second part of the data.

2. The data communication circuit of the SDRAM of claim 1, wherein the first part of the data comprises one of high address data and low address data, and the second part of the data comprise the remainder of the low address data or the high address data.

3. The data communication circuit of the SDRAM of claim 1, wherein the data input circuit comprises:
 a first D-type flip-flop circuit, for receiving the first part of the data input to the data communication circuit and outputting the first part of the data according to the preset clock signal; and
 a second D-type flip-flop circuit, for receiving an output of the first D-type flip-flop circuit and the second part of the data of the data communication circuit and regenerating the data by combining the first part data and the second part data according to the preset clock signal.

4. The data communication circuit of the SDRAM of claim 1, wherein the data output circuit comprises:
 a third D-type flip-flop circuit, for receiving the second part of the data output from the data communication circuit and outputting the second part of the data according to the preset clock signal;
 a selector, for receiving an output of the third D-type flip-flop circuit and the first part of the data of the data communication circuit and outputting the first part of the data or the second part of the data according to a counting signal; and
 a fourth D-type flip-flop circuit, for receiving an output of the selector and outputting the first part of the data or the second part of the data according to the preset clock signal.

5. The data communication circuit of the SDRAM of claim 4, wherein the data output signal further comprises a counter for generating the counting signal to the selector, and the selector outputs the first part of the data or the second part of the data according to the counting signal.

6. The data communication circuit of the SDRAM of claim 1, wherein the mask signal generating circuit comprises a multiplexer for receiving a DQM signal and outputting the DQM signal to the UDQM pin or the LDQM pin according to a flag status.

7. The data communication circuit of the SDRAM of claim 1, wherein the data communication circuit of the SDRAM is adapted for a video compact disk (VCD) system.

8. The data communication circuit of the SDRAM of claim 1, wherein the data communication circuit of the SDRAM is adapted for a digital video disk (DVD) system.

9. A data communication method of a synchronous dynamic random access memory (SDRAM), the SDRAM comprising a plurality of data pins coupled to a data bus of an optical storage medium, a width of the data bus being smaller than a number of the data pins, the SDRAM comprising an upper data mask (UDQM) pin and a lower data mask (LDQM) pin, the data communication method comprising:

enabling one of the UDQM pin and the LDQM pin and outputting a first part of data thereto when outputting the data to a part of the data pins of the SDRAM;

enabling another one of the UDQM pin and the LDQM pin and outputting a second part of the data when outputting the data to another part of the data pins of the SDRAM;

receiving the first part of the data from a part of the data pins and then receiving the second part of the data from another part of the data pins when the SDRAM receives the data; and regenerating the data by combining the first part and the second part of the data.

10. The data communication method of the SDRAM of claim 9, wherein the first part of the data comprise one of high address data and low address data, and the second part of the data comprise the remainder of the low address data or the high address data.

11. The data communication method of the SDRAM of claim 9 further comprises that providing a preset clock signal.

12. The data communication method of the SDRAM of claim 11, wherein the step of outputting the data to the SDRAM further comprises:

defining a period of a next preset clock signal as a first period while outputting the data to the SDRAM;

enabling one of the UDQM pin and the LDQM pin during the first period and outputting the first part of the data;

locking the second part of the data during the first period; and enabling another one of the UDQM pin and the LDQM pin during the second period and outputting the second part of the data.

13. The data communication method of the SDRAM of claim 11, wherein the step of receiving the data by the SDRAM further comprises:

defining a period of a next preset clock signal as a first period while outputting the data to the SDRAM;

enabling one of the UDQM pin and the LDQM pin during the first period and receiving the first part of the data;

enabling another one of the UDQM pin and the LDQM pin during the second period and receiving the second part of the data; and regenerating the data by combining the first part of the data and the second part of the data.

14. The data communication method of the SDRAM of claim 9, wherein the optical storage medium comprises a video compact disk system.

15. The data communication method of the SDRAM of claim 9, wherein the optical storage medium comprises a digital video display system.

* * * * *